United States Patent
van Es et al.

(10) Patent No.: US 10,935,568 B2
(45) Date of Patent: Mar. 2, 2021

(54) METHOD OF DETERMINING AN OVERLAY ERROR, METHOD FOR MANUFACTURING A MULTILAYER SEMICONDUCTOR DEVICE, ATOMIC FORCE MICROSCOPY DEVICE, LITHOGRAPHIC SYSTEM AND SEMICONDUCTOR DEVICE

(71) Applicant: Nederlandse Organisatie voor toegepast-natuurwetenschappelijk onderzoek TNO, 's-Gravenhage (NL)

(72) Inventors: Maarten Hubertus van Es, Voorschoten (NL); Hamed Sadeghian Marnani, The Hague (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 16/309,749

(22) PCT Filed: Jun. 16, 2017

(86) PCT No.: PCT/NL2017/050398
§ 371 (c)(1),
(2) Date: Dec. 13, 2018

(87) PCT Pub. No.: WO2017/217850
PCT Pub. Date: Dec. 21, 2017

(65) Prior Publication Data
US 2019/0310284 A1    Oct. 10, 2019

(30) Foreign Application Priority Data

Jun. 17, 2016 (EP) .................................... 16175008

(51) Int. Cl.
*G01Q 60/32*      (2010.01)
*G01N 21/17*      (2006.01)
(Continued)

(52) U.S. Cl.
CPC ......... *G01Q 60/32* (2013.01); *G01N 21/1702* (2013.01); *G01N 29/0681* (2013.01);
(Continued)

(58) Field of Classification Search
CPC ....... G01N 2291/2697; G01N 29/0681; G01N 29/348; G01N 29/42; G01N 2291/0231;
(Continued)

(56) References Cited

U.S. PATENT DOCUMENTS 6,392,229 B1 * 5/2002 Dana .................. G03F 7/70625
850/33
2004/0235205 A1 * 11/2004 Levy .................. G03F 7/70708
438/14

(Continued)

FOREIGN PATENT DOCUMENTS

JP    2010-101857 A     5/2010
JP    2010101857 A    * 5/2010

(Continued)

OTHER PUBLICATIONS

Hu et al., "Imaging of Subsurface Structures Using Atomic Force Acoustic Microscopy of GHz Frequencies," AIP Journal of Applied Physics 109, 084324, pp. 1-6 (2011).

(Continued)

*Primary Examiner* — Wyatt A Stoffa
(74) *Attorney, Agent, or Firm* — Leydig, Voit & Mayer, Ltd.

(57) ABSTRACT

Method of determining an overlay error between device layers of a multilayer semiconductor device using an atomic force microscopy system, wherein the semiconductor device comprises a stack of device layers comprising a first patterned layer and a second patterned layer, and wherein the atomic force microscopy system comprises a probe tip, wherein the method comprises: moving the probe tip and the (Continued)

semiconductor device relative to each other for scanning of the surface; and monitoring motion of the probe tip with tip position detector during said scanning for obtaining an output signal; during said scanning, applying a first acoustic input signal to at least one of the probe or the semiconductor device; analyzing the output signal for mapping at least subsurface nanostructures below the surface of the semiconductor device; and determining the overlay error between the first patterned layer and the second patterned layer based on the analysis.

13 Claims, 5 Drawing Sheets

(51) Int. Cl.
G01N 29/06 (2006.01)
G01N 29/275 (2006.01)
G01N 29/34 (2006.01)
G01N 29/42 (2006.01)
G03F 7/20 (2006.01)
G03F 9/00 (2006.01)
G01N 29/22 (2006.01)

(52) U.S. Cl.
CPC .......... *G01N 29/22* (2013.01); *G01N 29/275* (2013.01); *G01N 29/348* (2013.01); *G01N 29/42* (2013.01); *G03F 7/70616* (2013.01); *G03F 7/70633* (2013.01); *G03F 9/7061* (2013.01); *G01N 2021/1706* (2013.01); *G01N 2291/0231* (2013.01); *G01N 2291/2697* (2013.01)

(58) Field of Classification Search
CPC ... G01N 2021/1706; G01N 2201/1702; G01N 29/275; G01N 29/22; G01Q 60/24; G01Q 60/32; G03F 7/70616; G03F 7/70633; G03F 9/7061
See application file for complete search history.

(56) References Cited

U.S. PATENT DOCUMENTS

| 2006/0075807 | A1* | 4/2006 | Elrod | G01Q 60/32 73/105 |
| 2007/0044544 | A1* | 3/2007 | Chumakov | B82Y 35/00 73/105 |
| 2007/0107502 | A1* | 5/2007 | Degertekin | G01Q 60/38 73/105 |
| 2007/0220978 | A1* | 9/2007 | Su | G01N 29/075 73/632 |
| 2008/0276695 | A1* | 11/2008 | Prater | G01N 29/0681 73/105 |
| 2011/0036169 | A1* | 2/2011 | Shekhawat | G01N 29/0663 73/603 |
| 2011/0036170 | A1* | 2/2011 | Shekhawat | G01N 29/0663 73/603 |
| 2014/0020141 | A1* | 1/2014 | Passian | G01Q 60/32 850/33 |
| 2019/0154636 | A1* | 5/2019 | Sadeghian Marnani | G01Q 30/04 |

FOREIGN PATENT DOCUMENTS

JP 2012-088159 A 5/2012
WO WO 2012/044811 A1 4/2012

OTHER PUBLICATIONS

Kwak et al., "Visualization of Interior Structures with Nanoscaie Resolution Using Ultrasonic-Atomic Force Microscopy," Proc. of SPIE, vol. 8691, pp. 869117-1 to 869117-9 (2013).
European Patent Office, International Search Report in corresponding International Application No. PCT/NL2017/050398 dated Aug. 28, 2017 (3 pages).

* cited by examiner

METHOD OF DETERMINING AN OVERLAY ERROR, METHOD FOR MANUFACTURING A MULTILAYER SEMICONDUCTOR DEVICE, ATOMIC FORCE MICROSCOPY DEVICE, LITHOGRAPHIC SYSTEM AND SEMICONDUCTOR DEVICE

CROSS-REFERENCE TO RELATED APPLICATIONS

This patent application is a U.S. National Phase of PCT International Application No. PCT/NL2017/050398, filed Jun. 16, 2017, which claims priority to European Application No. 16175008.8, filed Jun. 17, 2016, which are both expressly incorporated by reference in their entireties, including any references contained therein.

FIELD OF THE INVENTION

The present invention is directed at a method of determining an overlay error between device layers of a multilayer semiconductor device using an atomic force microscopy system, wherein the semiconductor device comprises a stack of device layers comprising a first patterned layer and a second patterned layer. The invention is further directed at a manufacturing method for manufacturing of a multilayer semiconductor device, an atomic force microscopy device, a lithographic system and a semiconductor device.

BACKGROUND

Developments in the semiconductor industry are typically governed by Moore's law which predicts that the number of transistors in a dense integrated circuit doubles every two years. As will be appreciated, this poses significant technological challenges whenever technological boundaries constituted by physical laws are encountered and need to be overcome to meet the industry demands for even smaller and smaller integrated circuits.

One typical challenge encountered already in the twentieth century, was the need to take into account interlayer misalignment between functional layers of a multilayer semiconductor device. In the multilayered structure of semiconductor devices, functional device layers are typically deposited on top of other functional device layers. The functional product features, i.e. the features of the pattern formed in each layer, need to be aligned accurately with those in contiguous functional layers to enable correct operation of the end product: the semiconductor device. This is achieved by monitoring an overlay error during manufacturing by determining relative positions between marker elements in subsequent layers. The term 'overlay error' relates to the amount of misalignment between subsequent layers, and therefore includes offset errors (i.e. errors in the position of a layer in relation to other layers) as well as layer alignment errors (i.e. incorrect orientation of a layer with respect to other layers). This improvement, and the advancements achieved after this in the determination of overlay errors, has allowed to continue making semiconductor elements smaller and smaller over the past decennia, in accordance with Moore's law. The present state of the technology that is applied for measuring overlay error, is the use of diffraction optics to determine a relative distance between marker elements.

One of the key challenges in metrology is the measurement of targets that are covered by optically non-transparent layers, such as metal. In addition, with the device dimensions moving to the next nodes, it is desirable to perform metrology on product features, which requires higher lateral resolution than optics can provide. Recently, the use of metallic resist layers has gained interest in lithography. Moreover, new extreme ultraviolet (EUV) lithography methods allow deposition of metal layers, which are opaque to light. For these layers, verification of overlay error using conventional methods therefore is not possible. However, even for other materials, the conventional methods of determining overlay error are not ideal, e.g. by providing insufficient contrast or a low signal-to-noise (SNR) ratio wherein certain features may be badly visible. The present methods are therefore not ideal in view of computational overhead to determine the overlay error and limited control over the error determined.

Another disadvantage of current methods is that the marker features that can be 'seen' using the diffraction optical methods applied are of much larger dimensions than the functional product features, i.e. pattern features, nowadays desired in accordance with Moore's law. Therefore, even though the correct alignment of marker elements in subsequent layers of a multilayer semiconductor device can be established, this is no guarantee that also the much smaller pattern features in subsequent layers are correctly aligned. These small pattern features are differently affected by e.g. lens errors of the alignment sensor used. Hence, an undesired or destructive overlay error is more and more difficult to rule out during manufacturing, as devices become smaller.

SUMMARY OF THE INVENTION

It is an object of the present invention to obviate the abovementioned disadvantages of the prior art and to provide an accurate high resolution overlay error detection method that may be applied with existing lithography methods.

As stated above, throughout this document, the term 'overlay error' relates to the amount of misalignment between subsequent layers, and therefore includes offset errors (i.e. errors in the position of a layer in relation to other layers) as well as layer alignment errors (i.e. incorrect orientation of a layer with respect to other layers).

To this end, in accordance with a first aspect, there is provided herewith a method of determining an overlay error between device layers of a multilayer semiconductor device using an atomic force microscopy system, wherein the semiconductor device comprises a stack of device layers comprising at least a first patterned layer and a second patterned layer, and wherein the atomic force microscopy system comprises at least one scan head, the scan head including a probe, the probe comprising a cantilever and a probe tip arranged on the cantilever, wherein the method comprises: moving the probe tip and the semiconductor device relative to each other in one or more directions parallel to the surface for scanning of the surface with the probe tip; and monitoring motion of the probe tip relative to the scan head with a tip position detector during said scanning for obtaining an output signal; wherein the method further comprises: during said scanning, applying a first acoustic input signal comprising a signal component at a first frequency to at least one of the probe or the semiconductor device; analyzing the output signal for mapping at least subsurface nanostructures below the surface of the semiconductor device; and determining the overlay error between the first patterned layer and the second patterned layer based on the analysis.

The present invention enables direct measurement of the overlay error (including offset error and layer alignment error), independent of a material composition of the device layers, at a very high resolution. To this end, the invention applies ultrasound atomic force microscopy in a lithographic system to perform subsurface detection of nanostructures. This method can be applied independent of materials in the device layers. Moreover, this method allows simultaneous detection of nanostructures both below the surface of the device as well as at the surface of the device, and can thus be performed throughout the manufacturing process (e.g. after deposition of each layer) or all at the end (e.g. as a final check). Therefore, in accordance with some embodiments, the invention comprises an additional step of mapping on-surface nanostructures on the surface of the semiconductor device based on the output signal obtained with the tip position detector, although this step is optional.

Another advantage is that very high resolutions may be obtained—much higher than with conventional optical overlay error determination methods—by properly selecting the frequency of the acoustic input signal. The present invention therefore includes various embodiment directed at application of various different acoustic input signals within different frequency ranges, dependent on the desired resolution and contrast mechanisms (some material combinations may provide better contrast from elasticity than from scattering or vice versa).

Just in general, it will be understood that the present method may equally be applied with atomic force microscopy systems including one or multiple scan heads. Using multiple scan heads has the advantage of providing a higher throughput, which may thus be beneficial for example in industrial applications. Moreover, the method is not exclusively limited to application in lithographic systems and methods, but may also be applied to other methods, such as nanoimprinting. Moreover, in combination with lithographic systems it may generally be applied to many different types of lithographic methods, including extreme ultraviolet (EUV) lithography and electron beam lithography for example.

In accordance with some embodiments, the method comprises applying, during said scanning, a second acoustic input signal comprising a signal component at a second frequency to the semiconductor device. Applying multiple acoustic input signals, e.g. at slightly different frequencies, enables for example to down-convert a very high frequency acoustic signal to lower frequency ranges wherein the characteristics of the signal become measurable, using heterodyne measurement techniques. The advantage of this is that at these very high frequencies (e.g. above 1 gigahertz (GHz)), characteristics of the output signal include the influence of scattering of the acoustic signal at (nano) structures within the sample. At these frequencies, even very small device features become visible. Therefore, the method can be applied to directly measure the overlay error between patterned features of the device layers. As may be appreciated, other down-conversion techniques may also be applied, such as homodyne techniques.

In essence, in these embodiments, by applying a further acoustic input signal having a frequency $f_2$ that is slightly offset from a frequency $f_1$ of the (first) acoustic input signal, a mixed signal may be obtained therefrom comprising frequency components at the difference frequency $|f_2-f_1|$ and at the superposed frequency $(f_1+f_2)$. The former of these components, the component at the difference frequency $|f_2-f_1|$, becomes well measurable if the offset between both frequencies becomes small enough. The acoustic input signal that induces the acoustic waves, will diffract upon encountering a sub-surface structure. Therefore, by accurate tuning of both frequencies $f_1$ and $f_2$, the diffraction affected acoustic signal conveyed in the acoustic output signal becomes measurable by analyzing the signal component at the difference frequency $|f_2-f_1|$, even for the acoustic signals in the range above 1 GHz. Hence, this allows the sub-surface structures at micrometer and nanometer scale to become visible, enabling imaging thereof using the method of the present invention.

As a further important advantage of the application of a heterodyne measurement technique in accordance with the invention is that this allows the measurement of both phase and amplitude. In this respect, the method distinguishes from homodyne methods applying an amplitude modulated input signal, which allow measurement of amplitude only. The combination of measuring both phase and amplitude enables improvement of the detectability of subsurface structures, as it enables to distinguish between different material compositions.

Down-conversion is possible due to the dynamics of the interaction between the probe tip and the sample surface, which are governed by a non-linear transfer function. To understand the principles of these embodiments, it is important to realize that the mixing of the both acoustic input signals as such is not sufficient to obtain a signal component at the difference frequency, as desired. The desired frequency component finds its origin in the interaction between the sample surface and the probe tip, which has a non-linear character. This is due to the fact that this interaction is governed by the (non-linear) van der Waals and repulsive forces between atoms at the sample surface and atoms forming the probe tip, characterized by their Lennard-Jones potential. The output signal measured using the probe tip therefore contains the desired signal component at the difference frequency.

For example, in some embodiments, the first frequency is greater than 1 gigahertz (GHz) and the second frequency is greater than 1 gigahertz (GHz). For example, consider that the speed of sound in many solid materials at 20° C. typically ranges between 2500 m/s and 6500 m/s (for longitudinal waves). Assuming as a typical value a material having a speed of sound of $5*10^3$ m/s, an acoustic wave of 1 GHz will have a wavelength of $5*10^{-6}$ meter, i.e. 5 micrometer. Thus, the diffraction limit in this material allows sub-surface structures larger than 5 micrometer to be detectable with an acoustic input signal of 1 GHz. The diffraction limit decreases further at even higher frequencies and in materials with wherein the speed of sound is smaller. For an acoustic input signal of 10 GHz, ceteris paribus, structures of 500 nanometer or larger become detectable. For an acoustic input signal of 100 GHz, ceteris paribus, structures of 50 nanometer or larger become detectable.

In accordance with some embodiments, wherein the first frequency and the second frequency are such that a difference between the first and the second frequency is smaller than 10 megahertz, preferably smaller than 5 megahertz, and more preferably smaller than 1 megahertz. This yields signal components in the output signal that are within these same ranges, and which may well be detected and analyzed.

In yet other embodiments wherein a first and a second acoustic input signal is applied, the first frequency is within a range of 0.01 megahertz (MHz) to 100 megahertz (MHz) and wherein the second frequency is within a range of 0.01 megahertz (MHz) to 100 megahertz (MHz). In these ranges, scattering of the signal at internal or sub-surface structures does not play a role in the interaction between the sample and the applied signals. Instead, the characteristics of the output signal are indicative of the local visco-elastic properties of the sample at the location where it interacts with the surface. These elastic properties are, amongst others, dependent on the presence or absence of subsurface structures and their material composition. By applying again a heterodyne measurement technique, both phase and amplitude of the output signal become measurable. The frequencies may be tuned relative to each other to provide optimal contrast in the output signal, both for the determined amplitude of the output signal as for the phase. It is to be noted, as will be discussed further down below, that the invention is not restricted to applying both a first and a second acoustic input signal. Sub-surface structures may already be detected by applying an acoustic input signal having at least a single frequency within a range of 0.01 to 100 megahertz (MHz).

In general, in accordance with the present invention, there are many suitable ways of applying the acoustic input signal and the invention is not limited in this respect. However, in accordance with some embodiments, the first acoustic input signal is applied to the probe, and wherein the acoustic input signal is applied by means of at least one of a group comprising: an acoustic transducer connected to the cantilever or the probe tip, an electrostatic actuator cooperating with the cantilever, an electrostatic actuator cooperating with the probe tip wherein the probe tip is flexibly attached to the cantilever, or photothermic excitation of at least one of the cantilever or the probe tip.

It has been found that for use in an overlay error determination method to be applied e.g. in a lithographic process, contact between the sample or semiconductor device and application means such as a transducer or actuator of any kind is not desired. Therefore, non-contact methods to apply the acoustic input signal to the sample or methods wherein the acoustic input signal is not applied to the sample at all are preferred over direct-contact application methods wherein the acoustic input signal is applied e.g. by means of a transducer or actuator of any kind. Therefore, the input signal may be applied by excitation of the probe tip or cantilever, e.g. by means of a transducer, electrostatic excitation method or photothermic excitation.

Moreover, in accordance with some embodiments wherein the sample is to be excited, the second or the first acoustic input signal is applied to the semiconductor device, and the signal may be applied by means photothermic excitation of the surface of the semiconductor device. Photothermic excitation may for example be provided using a pulsating optical beam, i.e. an optical beam having a variating intensity. Contact between the sample and a transducer or other means is thereby no required.

As discussed briefly above, in accordance with some embodiments that do not necessarily require a second or further acoustic input signal (e.g. not relying on heterodyne measurement techniques), the first acoustic input signal is applied to the probe in absence of a further acoustic input signal, and the first frequency is within a range of 0.01 megahertz to 100 megahertz. Detection of subsurface structures, and thereby determination of overlay error, is already well possible in some cases by using one acoustic input signal having a frequency within the range given. In this range, detection is based on local elastic property determination of the sample surface using the stimulated probe tip.

The invention is further directed, in accordance with a second aspect thereof, to a method of manufacturing of a multilayer semiconductor device, comprising the steps of: forming, on a substrate, a stack of material layers comprising depositing of at least two subsequent patterned layers of semiconductor material, the patterned layers comprising a first patterned layer and a second patterned layer; and determining an overlay error between the first patterned layer and the second patterned layer; wherein the step of determining the overlay error comprises a method in accordance with the first aspect using an ultrasound atomic force microscopy device. The overlay error determination method described may well be integrated with the manufacturing method, e.g. a lithographic method, in particular (but not exclusively) where high throughput atomic force microscopy methods are applied that allow to perform such overlay detection methods to be performed efficiently during fabrication of semiconductor devices.

In accordance with a third aspect, therefore, the invention is directed at an atomic force microscopy device for use in a lithography system, the device comprising at least one scan head, the scan head including a probe, the probe comprising a cantilever and a probe tip arranged on the cantilever, wherein the device further comprises: an actuator cooperating with at least one of the scan head or a substrate holder for moving the probe tip and the semiconductor device relative to each other in one or more directions parallel to the surface for scanning of the surface with the probe tip; a tip position detector for measuring motion of the probe tip relative to the scan head during said scanning, the detector being arranged for providing an output signal indicative of said motion; and a controller for receiving and analyzing the output signal from the tip position detector; wherein the atomic force microscopy device further comprises: a first actuator for applying a first acoustic input signal comprising a signal component at a first frequency to at least one of the probe or the semiconductor device; wherein the controller is arranged for analyzing the output signal for mapping at least subsurface nanostructures below the surface of the semiconductor device, and for determining the overlay error between the first patterned layer and the second patterned layer based on the analysis. The AFM device may comprise one or more scan heads, as described hereinabove. Multiple scan heads provide the advantage of increasing the throughput.

The atomic force microscopy device may, in accordance with some embodiments, comprise a second actuator for applying a second acoustic input signal comprising a signal component at a second frequency to the semiconductor device. The first actuator may, in accordance with some embodiments, be arranged for applying the first acoustic input signal to the probe, wherein the first actuator comprises at least one element of a group comprising: an acoustic transducer connected to at least one of the cantilever or the probe tip, an electrostatic actuator cooperating with the cantilever, an electrostatic actuator cooperating with the probe tip wherein the probe tip is flexibly attached to the cantilever, or a pulsed optical source for photothermic excitation of at least one of the cantilever or the probe tip, such as a pulsed laser. In embodiments where at least one of the second or the first acoustic input signal is applied to the semiconductor device, the second actuator may, in accordance with some embodiments, comprise a pulsed optical source for applying the respective second or first acoustic input signal by means photothermic excitation of the surface of the semiconductor device.

In accordance with a fourth aspect, the invention is directed at a lithographic system for manufacturing of a multilayer semiconductor device, the system comprising and atomic force microscopy device according to the third aspect.

Moreover, in accordance with a fifth aspect, the invention is directed at a method of determining an alignment of a patterned device layer of a semi-finished multilayer semi-conductor device using an atomic force microscopy system, for reducing overlay error during manufacturing of the semiconductor device, wherein the semi-finished semiconductor device comprises a resist layer covering one or more layers including the patterned device layer, and wherein the atomic force microscopy system comprises at least one scan head, the scan head including a probe, the probe comprising a cantilever and a probe tip arranged on the cantilever, wherein the method comprises: moving the probe tip and the semiconductor device relative to each other in one or more directions parallel to the surface for scanning of the surface with the probe tip; and monitoring motion of the probe tip relative to the scan head with a tip position detector during said scanning for obtaining an output signal; wherein the method further comprises: during said scanning, applying a first acoustic input signal comprising a signal component at a first frequency to at least one of the probe or the semiconductor device; analyzing the output signal for mapping at least subsurface nanostructures below the surface of the semiconductor device; and determining the alignment of the patterned device layer based on the analysis; further including a step of, based on the determined alignment of the patterned device, adapting the alignment of the semiconductor device relative to an alignment of a further patterned device layer to be formed on the semiconductor device.

In accordance with a sixth aspect, the invention relates to multilayer semiconductor device manufactured using a method according to the second aspect.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

DETAILED DESCRIPTION

Figure 1:
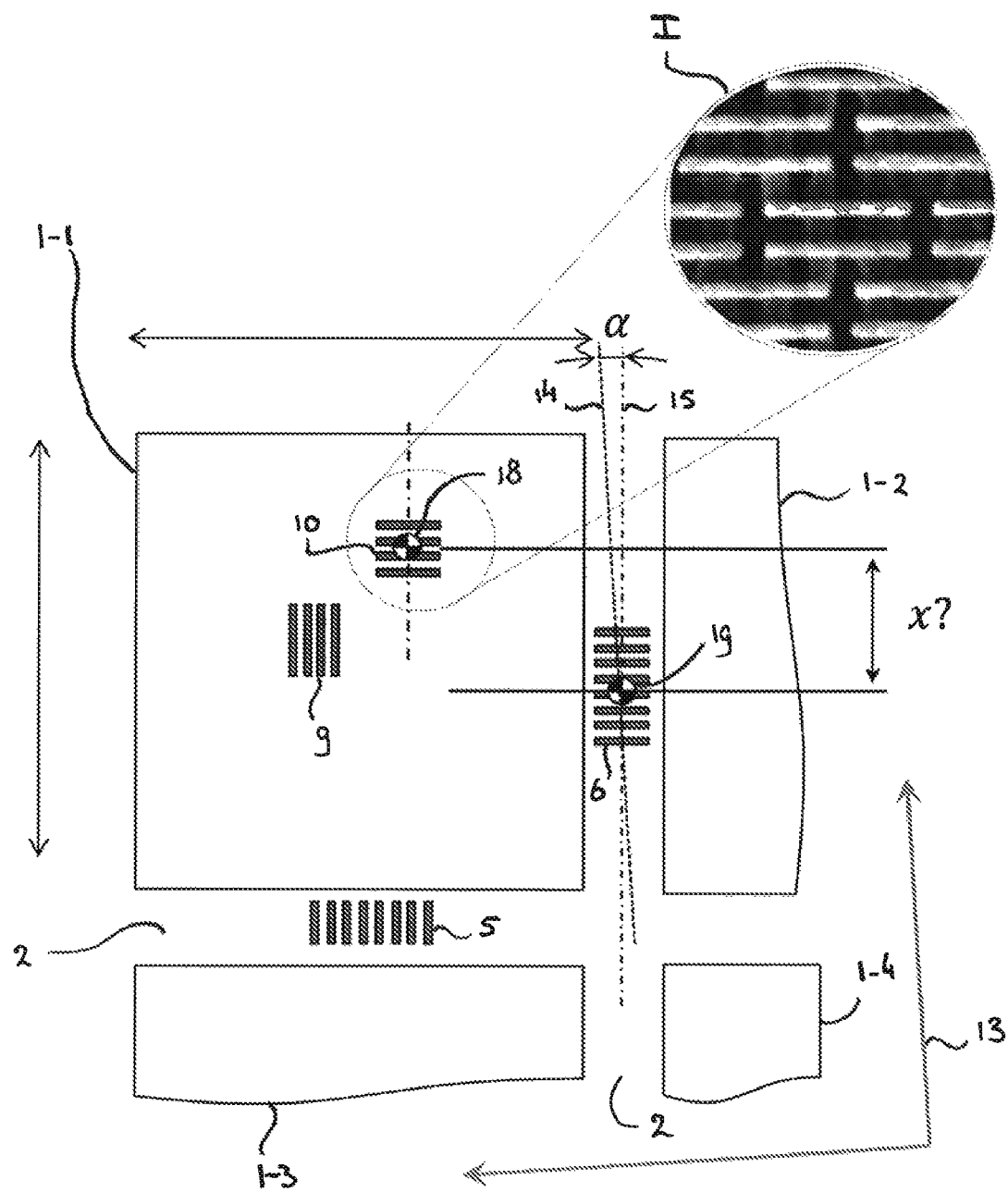
FIG. 1 schematically illustrates a method of overlay error detection.

FIG. 1 schematically illustrates a situation sketch of a semi-conductor device 1-1 on a wafer during manufacturing. In FIG. 1, semi-conductor device 1-1 is arranged on a wafer contiguous to a plurality of further semi-conductor devices 1-2, 1-3, 1-4. The wafer on which the devices 1-1, 1-2, 1-3 and 1-4 are arranged (not visible on the scale of focus of the situation sketch) may be placed on a metrology frame of a system for determining an overlay error in accordance with a present invention. The metrology frame at the wafer may not be neatly aligned, such that the scribing lanes 2 that separate the respective semi-conductor devices 1-1 to 1-4 (to be used for separating the semi-conductor devices) may be not be perfectly aligned with the metrology coordinate system 13 of the metrology frame. In FIG. 1, this is illustrated by the angle α between the alignment axes 15 of the scribing lane 2 and the alignment orientation 14 of the coordinate system 13 of the metrology frame.

In principle, semi-conductor devices of any arbitrary size may be produced in this manner. In FIG. 1, a size range of 1 mm to 33 mm is indicated as an example of possible dimensions of the length and width of the device. However, where needed also devices smaller then 1 mm or longer then 33 mm may be manufactured.

In the scribing lanes 2, in between two or more of the semi-conductor devices 1-1 through 1-4 to be created, one or more marker elements 5, 6 are present that allow to detect an overlay error between the subsequent layers of the multilayer semi-conductor devices 1-1 through 1-4. In FIG. 1, as can be seen the marker element 5 is present in the horizontal scribing lane 2 and a marker element 6 is present in the vertical scribing lane 2. The number and orientation of the marker elements, and the scribing lanes or other parts of the wafer wherein these may be located will be at the choice of the skilled person.

In addition, each of the semi-conductor devices 1-1 through 1-4 comprises two or more functional layers which comprise functional product features, also called pattern features 9, 10. In FIG. 1, schematically two pattern features 9 and 10 are illustrated but in reality the complex pattern of product features may be present in each functional product layer.

Conventionally, overlay error is determined by determining the relative positions of the marker elements 5 or 6 in subsequent layers, such as to establish the offset between these marker elements. Based on this offset, the system optics and other system parameters of the layer deposition system are calibrated such as to minimize or completely remove the offset.

Scanning probe microscopy is a highly accurate method of imaging nanostructures on the surface of a sample by scanning a probe with a probe tip across the sample surface, while keeping the probe tip in contact with the surface (contact mode) or vibrating the probe tip such as to tap the probe tip in contact with the surface during each cycle of vibration (tapping mode). As a skilled person will appreciate, other sensing modes are available for performing scanning probe microscopy, which are not further discussed here but which are known to the skilled person. In regular scanning probe microscopy methods, such as atomic force microscopy, only the nanostructures on the surface of the substrate are visualized. Because in principle the scanning probe microscope allows scanning across any desired distance, the accuracy can be obtained across any desired range of dimension.

Figure 2:
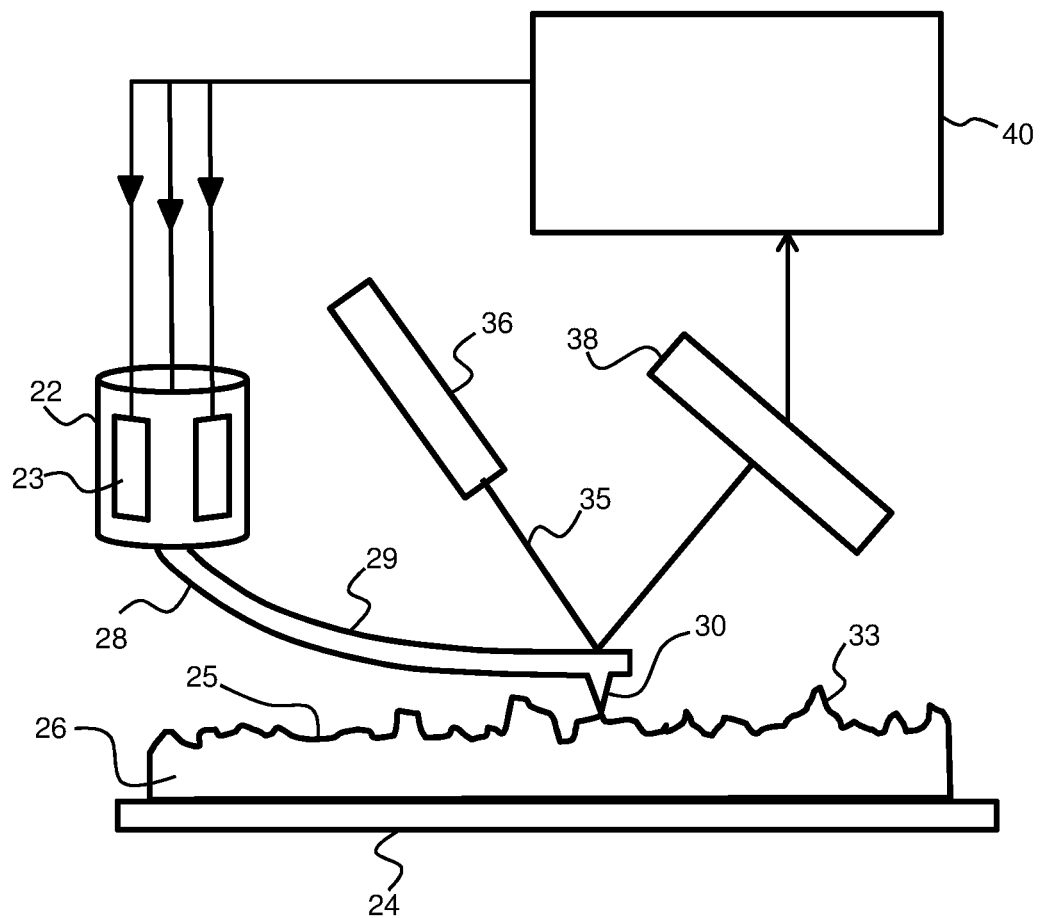
FIG. 2 schematically illustrates an atomic force microscopy system that may be used for performing the method for the present invention.

FIG. 2 schematically illustrates the working principle of a atomic force microscope (AFM) for sensing and mapping a surface topography of a sample surface. In FIG. 2, a probe head 22 comprises piezo type drivers 23 for the X-, Y-, and Z-directional motion of a probe 28. The probe 28 consists of a cantilever 29 having a probe tip 30 arranged for scanning a sample surface 25 of a sample 26. During scanning, a dither piezo (not shown) or other means of actuation such as photo-thermal actuation, electrostatic, etc, may drive the cantilever in vibrational mode (for example close to resonant frequency) to enable tapping of the probe tip on the surface. The manner of applying a vibrational motion to the probe tip is known to the skilled person. Alternatively, many other modes of operating the AFM may be applied. For example, the AFM may be operated in contact mode wherein no tapping is performed, and wherein the probe is held in continuous contact with the surface 25 during scanning.

Scanning of the sample surface 25 is performed by moving the probe tip 30 in the X- and Y direction parallel to the sample surface 25 (or alternatively, by moving the substrate surface in the X- and Y-directions while maintaining the position of the probe tip fixed in the X- and Y-directions). The probe tip 30 is brought in close proximity to the surface 25 by means of a z-directional piezo driver. Once in position, in case the AFM is to be operated in tapping mode, the probe tip 30 is vibrated in the z-direction such that it repeatedly touches the surface 25 during scanning thereof (i.e. tapping). In contact mode, continuous contact between the probe tip 30 and the surface 25 is to be established and maintained. Alternatively, in non-contact mode, the probe tip 30 is brought in close proximity to the surface 25 by means of a z-directional piezo driver, and the probe tip is vibrated without touching the surface 25. However, during vibration, the probe tip 30 approaches the surface 25 close enough to experience force interactions with the surface, e.g. due to van der Waals forces. Alternatively, even other modes of operation of the AFM exist to perform surface measurements of various kinds.

The sample surface 25 is carried using a sample carrier 24. At the same time, a laser 36 illuminates the probe tip with laser beam 35. The precise position in the z-direction is determined using photo diodes 38 which receive the reflected laser beam 35. Deflections of the probe tip caused by height differences resulting from structures (e.g. element 33) on the surface 25, may be measured directly (e.g. by analyzing the signal from photo diode 38) or indirectly via a feedback mechanism. In such a feedback mechanism, the signal from photo diode 38 may be held constant by adjusting the height of the probe above the surface. This may for example be achieved by driving of the piezo drivers 23 located on the probe head 22 dependent on a sensor signal from the photo diode 38, using feedback electronics 40. The feedback electronics 40 may record the height adjustments to determine the surface topography, or more accurately, the height corrections may accurately measured using an additional z-level sensor (not shown). This principle allows for very precise mapping of surface elements, such as surface element 33 on the surface 25 of the sample 26. Atomic force microscopy performed e.g. using a technique as illustrated in FIG. 2 allows the mapping of very small structures and features on the surface, e.g. nanostructures having typical nanometer dimensions (e.g. even <1 nm, such as for example individual polymer strings being as thin as 0.4 nm).

In accordance with the present invention, atomic force microscopy is used to perform overlay error determination, e.g. during manufacturing of semiconductor devices. The invention applies a modified atomic force microscopy technique to perform sub-surface measurements, i.e. the mapping of sub-surface structures that are located beneath the surface of the sample. In principle, this is achieved by applying an additional acoustic input signal to either one or both of the probe 28 (e.g. the probe tip 30 or cantilever 29) or the sample 26. Dependent on the frequency of the input signal, this allows to determine the local elastic properties of the sample (e.g. at frequencies of the input signal between 1 and 100 MHz) which is dependent on any sub-surface structures present, or enables detection of sub-surface structures due to scattering of the acoustic signal at such subsurface structures (e.g. at frequencies of the input signal above 1 GHz).

Moreover, where two or more input signals are applied at slightly different frequencies, the application of heterodyne measurement techniques enables to obtain information on the phase and amplitude of an output signal, i.e. increasing the amount of information obtainable from the output signal to thereby improve the measurements (e.g. in terms of accuracy, signal-to-noise ratio, contrast, etcetera).

Alternatively, homodyne measurement techniques may be applied, e.g. by applying three frequency components: a carrier frequency $f_c$, the carrier frequency $f_c$ lowered by a modulation frequency $f_m$ to obtain a frequency component $f_c-f_m$, and the carrier frequency $f_c$ increased by the modulation frequency $f_m$ to obtain a frequency component $f_c+f_m$. Offering these frequency component signals in a favorable signal component ratio (e.g. $f_c:(f_c-f_m):(f_c+f_m)=1:0.5:0.5$) yields an amplitude modulated wave having a frequency $f_c$ wherein the amplitude modulates at a frequency $f_m$. Ultrasonic force microscopy may for example performed by applying an ultrasonic signal to the sample (i.e. at MHz range) and modulating the ultrasonic wave with a modulation frequency of approximately the cantilever resonance frequency (i.e. at kHz range). By sensing the output signal at the modulation frequency and analyzing the amplitude and/or phase, subsurface structures can be imaged. This is due to the fact that the high frequency ultrasonic signal is perturbed by the subsurface structures. Information on the subsurface structures is conveyed via these perturbations and becomes measureable in the deflection of the probe tip, i.e. the output sensor signal at the cantilever frequency.

The method of the present invention is preferably applied in contact-mode type AFM. It may however also be applied using other modes such as tapping mode, although in tapping mode the duration of periodic contact moments is relatively short and proper filtering of disturbances is required. Where desired, the on-surface structures, e.g. element 33 in FIG. 2, may be detected and mapped simultaneously with any sub-surface structures in order to determine an overlay error between two (or more) subsequent layers. However, the invention also enables to determine overlay error of lower layers below the surface, i.e. internal to the device. Thus, it is not required to perform a mapping of on-surface structures. The invention may be applied to determine overlay error of any two or more device layers, either on or below the surface, by applying atomic force microscopy in combination with the application of one or more acoustic input signals applied to the probe or the sample (i.e. semiconductor device). This thereby opens up a myriad of possibilities for determining overlay error during manufacturing of a semiconductor device.

Figure 3:
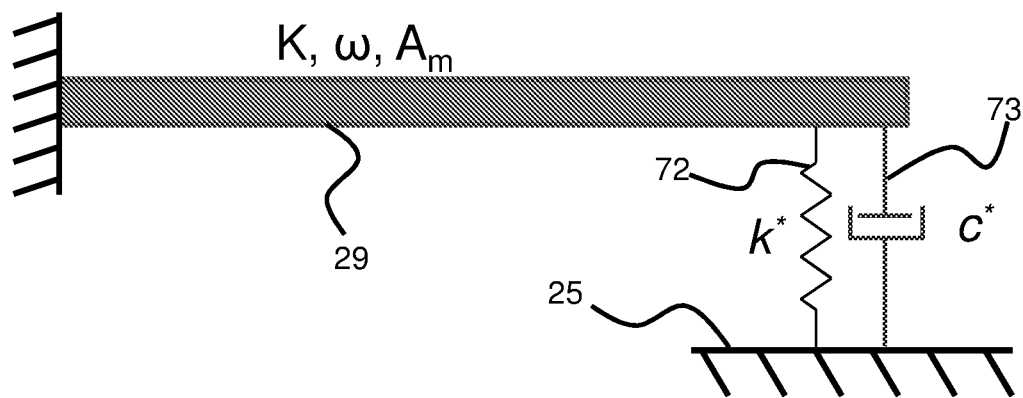
FIG. 3 schematically illustrates non-linear interaction between a probe tip and a sample surface.
Figure 4:
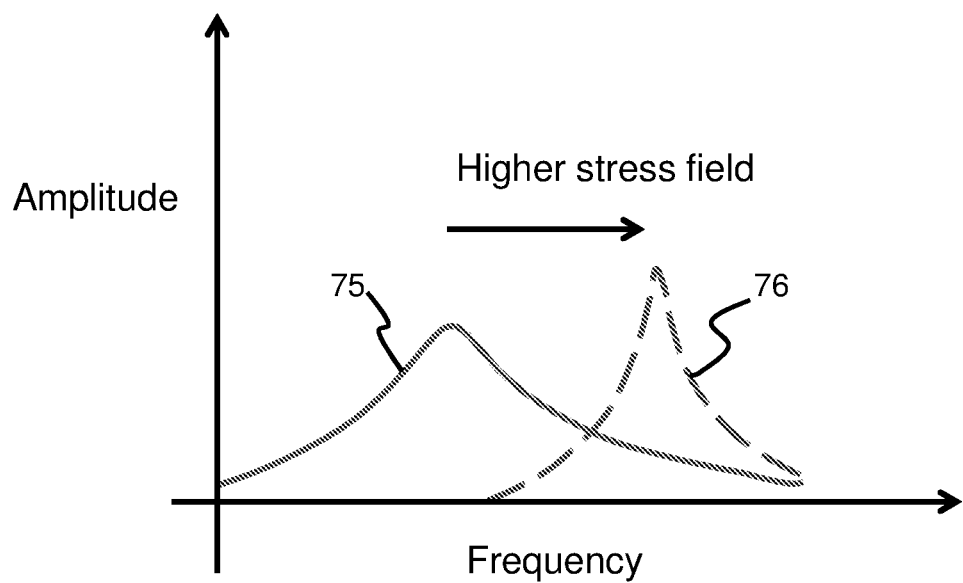
FIG. 4 illustrates the frequency response characteristic with and without non-linear interaction with a sample surface.

FIG. 3 schematically illustrates the interaction between the probe tip and the sample surface 25. In FIG. 3, the cantilever 29 is schematically illustrated with the surface 25. At the end of the cantilever 29, where the probe tip (not shown) is located, the interaction between the probe tip and the sample was schematically illustrated by elements 72 and 73. This interaction is characterized on one hand by non-linear elasticity, as illustrated by spring 72 with spring constant k*. On the other hand, the interaction is characterized by interaction loss schematically illustrated by damper 73 characterized by c*. In case the cantilever is allowed to vibrate freely, these interaction characteristics k* and c* are absent as they result from interaction with the sample surface 25. In FIG. 4, the frequency characteristic of the cantilever in free vibration is illustrated by the line 75. In contact with the surface 25, characterized by the above described non-linear interaction, the frequency response characteristic is illustrated by the dotted line 76 in FIG. 4. As follows from FIG. 4, the tip-sample interactions illustrated in FIG. 3 significantly influence the frequency response characteristics of the probe 28. The exact characteristics indicated by the dotted line 76 in FIG. 4 are dependent on the parameters k* and c* of the tip-sample interaction. Therefore, because in the presence of subsurface structures underneath the surface 25 of the sample the elasticity of the surface 25 is different from locations where no subsurface structures are present, the presence of these subsurface structures may be detected by measuring the response to acoustic vibrations induced in the probe tip 30 while being in contact with the surface 25.

Figure 5:
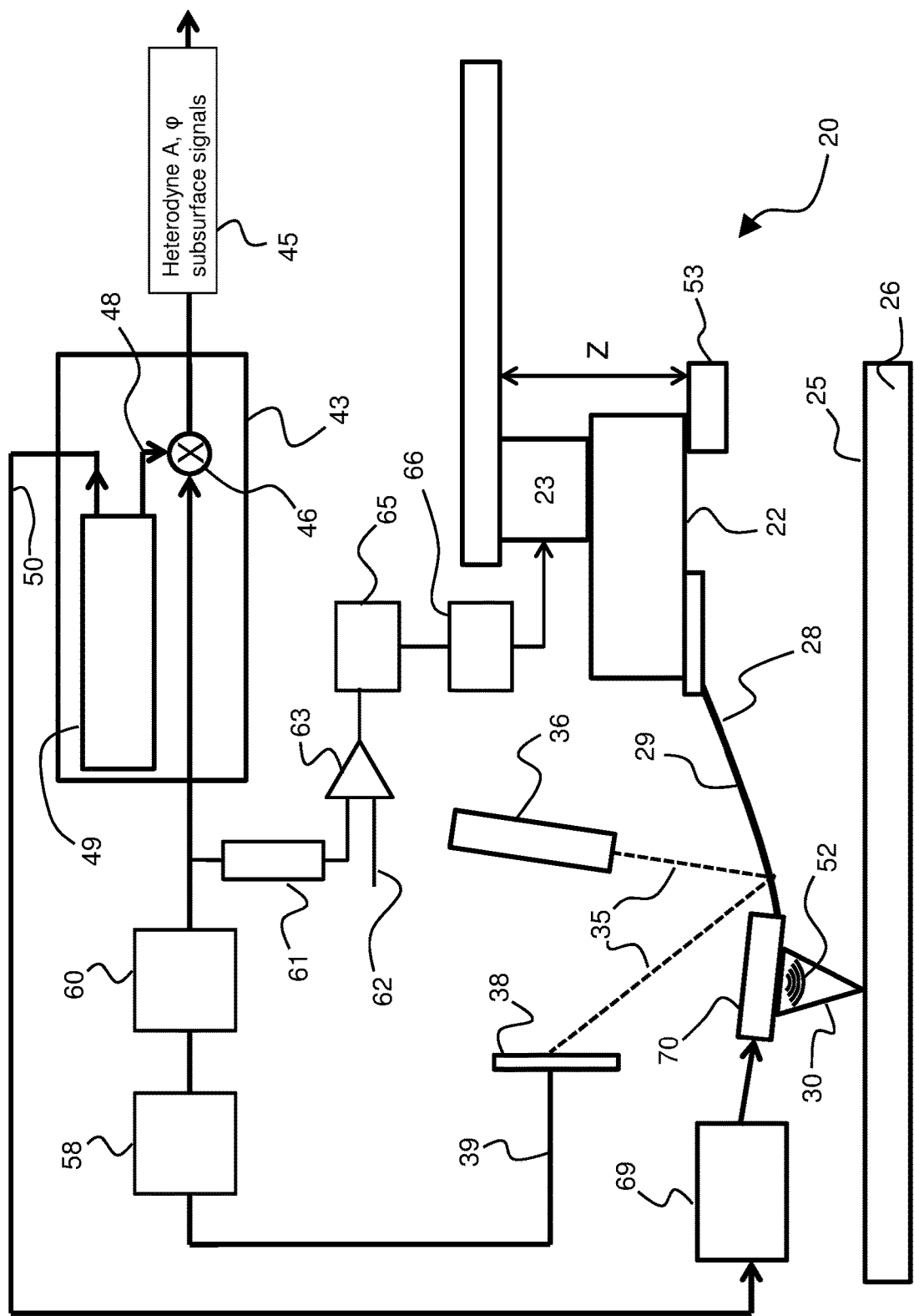
FIG. 5 schematically illustrates a system that may be used for performing a method of the present invention.

FIG. 5 schematically illustrates a measurement system that may be applied for performing a method in accordance with the present invention. In the system 20, a probe 28 is attached to a scan head 22. The scan head 22 enables scanning of the probe 28 relative to the surface 25 of a sample 26. The probe 28 consists of a cantilever 29 and a probe tip 30. During scanning, the probe tip 30 is brought in contact with the surface 25 of the sample 26. For example the probe tip 30 may be scanned across the surface 25 of the sample 26 in contact mode (continuous contact between the probe tip 30 and the surface 25 of the sample 26). A laser unit 36 provides a laser beam 35 that impinges on the cantilever 29 and reflects towards an optical detector 38 (e.g. photo diode). Using the optical detector 38, vibrations in the cantilever 29 can be sensed due to small deflections of the reflected beam 35 under influence of such vibrations. This provides an output signal 39 for further analysis. As may be appreciated, although in FIG. 5 a single scan head 22 is depicted, the method may equally be applied in systems including multiple scan heads.

In accordance with the present invention, a generator 49 provides a vibrational input signal 50. Dependent on the method applied and the frequency range of the acoustic input signal used for measuring, the vibrational input signal 50 may comprise various signal components. In the system illustrated in FIG. 5, the signal 50 comprises three different frequency components: a carrier frequency $f_c$, the carrier frequency $f_c$ lowered by a modulation frequency $f_m$ to obtain a frequency component $f_c-f_m$, and the carrier frequency $f_c$ increased by the modulation frequency $f_m$ to obtain a frequency component $f_c+f_m$. Offering these frequency components in a component ratio $f_c:(f_c-f_m):(f_c+f_m)=1:0.5:0.5$ yields an amplitude modulated wave having a frequency $f_c$ wherein the amplitude modulates at a frequency $f_m$. This amplitude modulated signal is vibrational input signal 50.

In FIG. 5, in accordance with the present invention, the vibrational input signal 50 is converted into an acoustic signal 52 to be applied during scanning. In the embodiment of FIG. 5, a transducer unit 70 is in contact with the probe tip 30, and receives the input signal 50 that is amplified using power amplifier 69. The transducer 70 converts the input signal 50 to an acoustic signal 52 applied to the probe tip 30.

As explained hereinabove in relation to FIGS. 3 and 4, vibrations of the cantilever 29 and the probe tip 30 are characterized by the frequency response characteristic which is in turn influenced by the elastic properties k* of the surface 25 and interaction loss c*. Any sub-surface structures will be noticeable due to variations in the local elastic properties of the surface 25, changing the vibration response of the cantilever 29 and the probe tip 30. This is measured through photo diode 38 and may thus be derived from output signal 39 by analyzing the output signal. This output signal 39 is provided to the analysis system 43 (e.g. lockin amplifier). In the analysis system 43, the output signal 39 is compared with a reference signal 48. The reference signal 48 obtained from the generator 49, and the comparison is represented by element 46 in FIG. 5. At the output of the analysis system 43, there is provided an output signal 45 comprising the amplitude A(x, y) and φ(x, y) of the output signal 39 from the optical detector 38. By mapping these location dependent amplitude and phase signals, sub-surface structures may be visualized in accordance with the present invention.

In addition to mapping sub-surface structures, the system 20 is further arranged for performing regular atomic force microscopy such as to map on-surface structures on the surface 25. To this end, the output signal 39, after pre-amplification in pre-amplifier 58 and after pre-analysis in analyzer 60, is provided both to the lockin amplifier analysis system 43 and to a low pass filter 61. The low pass filter removes the high frequency components relating to the sub-surface measurements from the output signal and provides the signal to a comparator 63. The comparator compares the output signal with the set-point that is received at input 62 (e.g. from a controller system), and yields a differential signal that is provided to the feedback controller 65. The feedback controller provides a control signal for driving the piezo-electric actuators 23 for adjusting the z-level of the probe 28, i.e. the distance in height of the probe 28 above the surface 25. The corrections, which may be obtained from the feedback controller 65 by analyzing the control signal, may be more accurately determined with z-level sensor 53. The determined z-level corrections are mapped to provide a surface topography map of the surface 25.

In accordance with an alternative embodiment, to detect and map sub-surface structures, a heterodyne measurement technique at GHz input frequencies may be applied. This may be achieved by applying some of the generated signal components to the sample 26, although this is not a requirement. At these high frequencies, sub-surface structures are detected via scattering of the acoustic signal at these structures. Other signal components are preferably applied to the probe, which may be done via power amplifier 69 and transducer 70.

In case of heterodyne measurement at GHz input frequencies, the vibrational input signal 50 comprises a first signal component which is periodic with a frequency f1 and which is applied to the cantilever 29 or probe tip 30. An additional vibrational signal (not shown in FIG. 5) may be generated by generator 49 having a second signal component which is periodic with a frequency f2. This additional vibrational input signal is in that case applied to the sample surface 25. For performing overlay measurements in a lithographic system, this additional vibrational signal is applied using a non-contact excitation technique, e.g. via photo-thermal stimulation of the surface 25 using a pulsed laser source (not shown) the intensity of which is modulated by the additional vibrational signal. In the system 20 of FIG. 5, the pulsed laser source would require an additional laser source in addition to the existing source 36. Due to the pulsation modulation of the laser beam directed at surface 25, a variable amount of heat is provided to the surface continuously, resulting in acoustic vibrations in the sample. The frequencies f1 and f2 are both above 1 gigahertz (GHz). For example, these signals may range anywhere above 1 GHz, e.g. 10 GHz or 20 GHz. Characteristic for the frequencies f1 and f2 of the vibrational input signal 50 is that the difference between f1 and f2 is below 1 GHz.

Figure 6A:
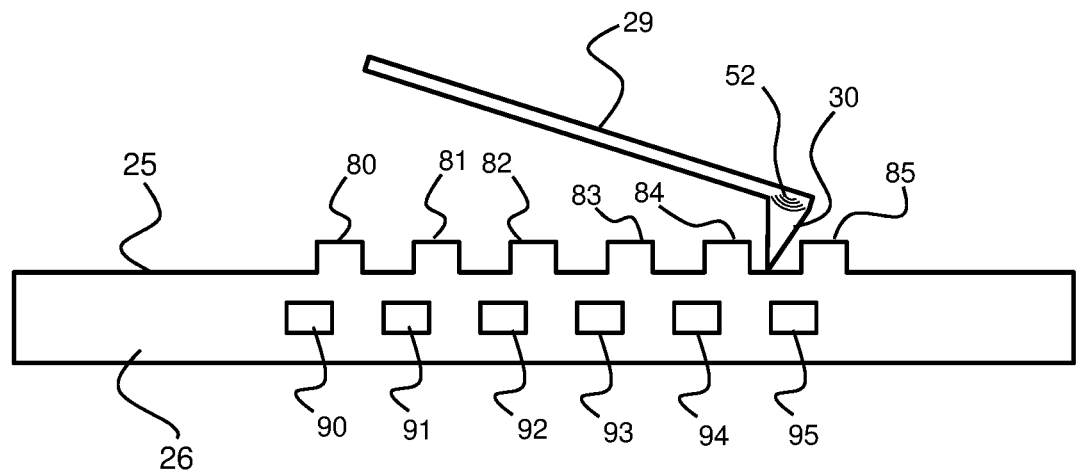
FIGS. 6A and 6B schematically illustrate the method of the present invention.
Figure 6B:
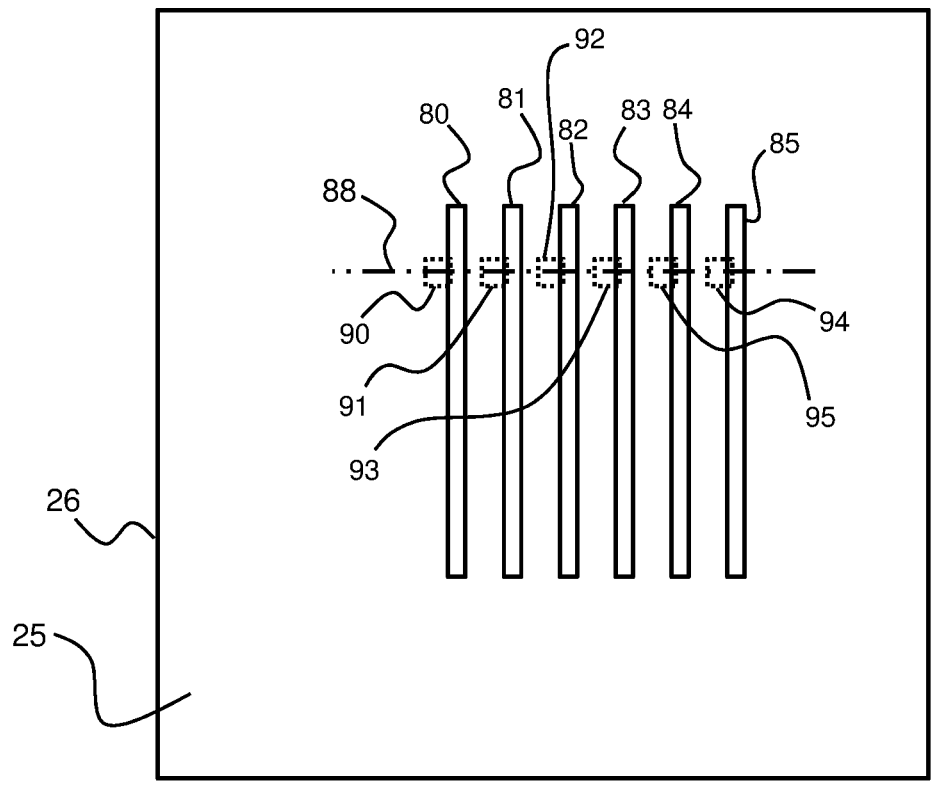

An example of a method of the present invention is illustrated in FIGS. 6A and 6B. In FIG. 6A, a sample 26 comprises plurality of device layers. The top layer being created comprises a surface 25. On the surface, a plurality of structures 80, 81, 82, 83, 84 and 85 have been created during manufacturing of the device. A probe comprising a cantilever and a probe tip 30 is scanned across the surface 25. In FIG. 6B, the scan path 88 illustrates the path along which the probe tip 30 is scanned. Underneath the surface 25, a plurality of subsurface structures 90, 91, 92, 93, 94 and 95 have been created in a deeper layer. The structures 90-95 were intended to be aligned with the structures 80-85, e.g. providing internal contacts for these structures 80-85. As can be seen in FIGS. 6A and 6B, an error in the alignment causes the structures 90-95 to be not perfectly underneath the structures 80-85.

Applying the method in accordance with the present invention enables to simultaneously map the surface topology of the surface structures 80-85 on the surface 25. This is achieved by performing regular contact mode atomic force microscopy on surface 25. The probe tip 30 is scanned across the surface 25 while being in continuous contact therewith. Upon encountering a surface structure, e.g. structure 84, the probe tip 30 is forced upward, which can be detected by the photo diode 38 of the system. In the preferred manner of determining the height differences, the signal obtained from the photo diode 38 is kept constant, by slightly moving the probe 28 up or down dependent on the variations in the output signal 39 of the photo diode 38. The height corrections can be determined directly from the feedback system as well as with an additional z-level sensor 53.

Simultaneously, an acoustic input signal 52 is applied to the probe tip 30 for performing sub-surface microscopy. As explained hereinabove, the acoustic input signal 52 allows to map the subsurface structures 90-95 either by means of scattering, or by means of measuring the local elastic properties of the surface 25. By mapping the elements 90-95 on the topology map of the surface 25, the alignment error can be detected. After detecting alignment error, the lithography system may be calibrated using a feedback mechanism. Therefore, by performing the overlay error detection method of the present invention periodically during the manufacturing process, overlay error is reduced to a minimum throughout the manufacturing process of semiconductor devices.

The present invention may also be applied in order to determine an alignment of a device layer prior to forming a further layer on to of a semi-finished semiconductor device, i.e. during manufacturing of multilayer semiconductor devices. For example, sub-surface AFM may be performed to determine the alignment of a device layer underneath a resist layer. In that case, prior to forming the next layer, the alignment of the exposure relative to the detected device layer orientation and alignment may be modified to reduce or even prevent an overlay error therebetween. The method is not very different from what has been described so far, except that it is performed on the device prior to depositing or creating the subsequent patterned layer and correction is performed up-front.

The present invention has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. Also kinematic inversions are considered inherently disclosed and to be within the scope of the invention. In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. A method of determining an overlay error between device layers of a multilayer semiconductor device using an atomic force microscopy system, wherein the multilayer semiconductor device comprises a stack of device layers comprising at least a first patterned layer and a second patterned layer, and wherein the atomic force microscopy system comprises at least one scan head, the scan head including a probe, the probe comprising a cantilever and a probe tip arranged on the cantilever, wherein the method comprises:

moving the probe tip and the semiconductor device relative to each other in one or more directions parallel to a surface for a scanning of the surface with the probe tip; and monitoring a motion of the probe tip relative to the scan head with a tip position detector during said scanning for obtaining an output signal;

applying, during said scanning, a first acoustic input signal comprising a signal component at a first frequency to at least one of the probe or the semiconductor device;

applying, during said scanning, a second acoustic input signal comprising a signal component at a second frequency to the semiconductor device;

providing the output signal to both an analysis system and a low pass filter;

analyzing the output signal using the analysis system for providing at least a subsurface nanostructures mapping below a surface of the semiconductor device;

filtering the output signal using the low-pass filter for providing a filtered output signal, providing the filtered output signal to a feedback controller, and analyzing a control signal of the feedback controller for providing an on-surface structures mapping on the surface of the semiconductor device; and determining the overlay error between the first patterned layer and the second patterned layer based on the subsurface nanostructures mapping and the on-surface structures mapping, wherein the first frequency is greater than 1 gigahertz and wherein the second frequency is greater than 1 gigahertz.

2. The method of claim 1 wherein the first frequency and the second frequency are such that a difference between the first frequency and the second frequency is smaller than 5 megahertz.

3. The method of claim 1 wherein the first frequency and the second frequency are such that a difference between the first frequency and the second frequency is smaller than 1 megahertz.

4. The method according to claim 1, wherein the first acoustic input signal is applied to the probe, and wherein the first acoustic input signal is applied by at least one of the group consisting of:
an acoustic transducer connected to the cantilever or the probe tip,
an electrostatic actuator cooperating with the cantilever,
an electrostatic actuator cooperating with the probe tip wherein the probe tip is flexibly attached to the cantilever, and
a photothermic excitation of at least one of the cantilever or the probe tip.

5. The method according to claim 1, wherein the second acoustic input signal or the first acoustic input signal is applied to the semiconductor device, and wherein the second acoustic input signal or the first acoustic input signal applied to the semiconductor device is applied by a photothermic excitation of the surface of the semiconductor device.

6. A method of determining an overlay error between device layers of a multilayer semiconductor device using an atomic force microscopy system, wherein the multilayer semiconductor device comprises a stack of device layers comprising at least a first patterned layer and a second patterned layer, and wherein the atomic force microscopy system comprises at least one scan head, the scan head including a probe, the probe comprising a cantilever and a probe tip arranged on the cantilever, wherein the method comprises:

moving the probe tip and the semiconductor device relative to each other in one or more directions parallel to a surface for a scanning of the surface with the probe tip; and
monitoring a motion of the probe tip relative to the scan head with a tip position detector during said scanning for obtaining an output signal;
applying, during said scanning, a first acoustic input signal comprising a signal component at a first frequency to at least one of the probe or the semiconductor device;
providing the output signal to both an analysis system and a low pass filter;
analyzing the output signal using the analysis system for providing at least a subsurface nanostructures mapping below a surface of the semiconductor device;
filtering the output signal using the low-pass filter for providing a filtered output signal, providing the filtered output signal to a feedback controller, and analyzing a control signal of the feedback controller for providing an on-surface structures mapping on the surface of the semiconductor device; and determining the overlay error between the first patterned layer and the second patterned layer based on the subsurface nanostructures mapping and the on-surface structures mapping, wherein the first acoustic input signal is applied to the probe in absence of a further acoustic input signal, and wherein the first frequency is within a range of 0.01 megahertz to 100 megahertz.

7. A method of manufacturing of a multilayer semiconductor device, comprising the steps of:

forming a stack of material layers on a substrate, the forming comprising depositing at least two subsequent patterned layers of semiconductor material, the at least two subsequent patterned layers comprising a first patterned layer and a second patterned layer; and
determining, using an ultrasound atomic force microscopy device, an overlay error between the first patterned layer and the second patterned layer,
wherein the atomic force microscopy device comprises at least one scan head, the scan head including a probe, the probe comprising a cantilever and a probe tip arranged on the cantilever, and
wherein the determining comprises:
moving the probe tip and the semiconductor device relative to each other in one or more directions parallel to a surface for a scanning of the surface with the probe tip; and
monitoring a motion of the probe tip relative to the scan head with a tip position detector during said scanning for obtaining an output signal;
applying, during said scanning, a first acoustic input signal comprising a signal component at a first frequency to at least one of the probe or the semiconductor device;
applying, during said scanning, a second acoustic input signal comprising a signal component at a second frequency to the semiconductor device;
providing the output signal to both an analysis system and a low pass filter;
analyzing the output signal using the analysis system for providing at least a subsurface nano structures mapping below a surface of the semiconductor device;
filtering the output signal using the low-pass filter for providing a filtered output signal, providing the filtered output signal to a feedback controller, and analyzing a control signal of the feedback controller for providing an on-surface structures mapping on the surface of the semiconductor device; and
determining the overlay error between the first patterned layer and the second patterned layer based on the subsurface nanostructures mapping and the on-surface structures mapping,
wherein the first frequency is greater than 1 gigahertz and wherein the second frequency is greater than 1 gigahertz.

8. An atomic force microscopy device for use in a lithography system, the device comprising a scan head, the scan head including a probe, the probe comprising a cantilever and a probe tip arranged on the cantilever, wherein the device further comprises:
an actuator cooperating with at least one of the scan head or a substrate holder for moving the probe tip and the semiconductor device relative to each other in one or more directions parallel to the surface for a scanning of the surface with the probe tip;

a tip position detector for measuring a motion of the probe tip relative to the scan head during the scanning, the detector being arranged for providing an output signal indicative of said motion;
a controller for receiving and analyzing the output signal from the tip position detector;
a first actuator for applying a first acoustic input signal comprising a signal component at a first frequency to at least one of the probe or the semiconductor device;
a second actuator for applying a second acoustic input signal comprising a signal component at a second frequency to the semiconductor device; and
a low pass filter,
wherein both the controller and the low pass filter are configured for receiving the output signal;
wherein the low-pass filter is configured for filtering the output signal, for providing a filtered output signal, and for providing the filtered output signal to a feedback controller,
wherein the controller is configured for analyzing a control signal of the feedback controller for providing an on-surface structures mapping on the surface of the semiconductor device; and
wherein the controller is further arranged for:
analyzing the output signal for providing at least a subsurface nanostructures mapping below a surface of the semiconductor device, and
determining the overlay error between the first patterned layer and the second patterned layer based on the subsurface nanostructures mapping and the on-surface structures mapping,
wherein the first frequency is greater than 1 gigahertz and wherein the second frequency is greater than 1 gigahertz.

9. The atomic force microscopy device according to claim 8, wherein the first actuator is arranged for applying the first acoustic input signal to the probe, and
wherein the first actuator comprises at least one element of the group consisting of:
an acoustic transducer connected to at least one of the cantilever or the probe tip,
an electrostatic actuator cooperating with the cantilever,
an electrostatic actuator cooperating with the probe tip wherein the probe tip is flexibly attached to the cantilever, and
a pulsed optical source for photothermic excitation of at least one of the cantilever or the probe tip.

10. The atomic force microscopy device according to claim 8, wherein at least one of the second acoustic input signal or the first acoustic input signal is applied to the semiconductor device, and
wherein second actuator comprises a pulsed optical source for applying the respective second acoustic input signal or the first acoustic input signal by a photothermic excitation of the surface of the semiconductor device.

11. The atomic force microscopy device according to claim 9 wherein the pulsed optical source for photothermic excitation comprises a pulsed laser.

12. A lithographic system for manufacturing of a multilayer semiconductor device, wherein the system comprises an atomic force microscopy device comprising a scan head, the scan head including a probe, the probe comprising a cantilever and a probe tip arranged on the cantilever,
wherein the atomic force microscopy device further comprises:
an actuator cooperating with at least one of the scan head or a substrate holder for moving the probe tip and the semiconductor device relative to each other in one or more directions parallel to the surface for a scanning of the surface with the probe tip;
a tip position detector for measuring a motion of the probe tip relative to the scan head during the scanning, the detector being arranged for providing an output signal indicative of said motion;
a controller for receiving and analyzing the output signal from the tip position detector;
a first actuator for applying a first acoustic input signal comprising a signal component at a first frequency to at least one of the probe or the semiconductor device;
a second actuator for applying a second acoustic input signal comprising a signal component at a second frequency to the semiconductor device; and
a low pass filter,
wherein both the controller and the low pass filter are configured for receiving the output signal;
wherein the low-pass filter is configured for filtering the output signal, for providing a filtered output signal, and for providing the filtered output signal to a feedback controller,
wherein the controller is configured for analyzing a control signal of the feedback controller for providing an on-surface structures mapping on the surface of the semiconductor device; and
wherein the controller is further arranged for:
analyzing the output signal for providing at least a subsurface nano structures mapping below a surface of the semiconductor device, and
determining the overlay error between the first patterned layer and the second patterned layer based on the subsurface nanostructures mapping and the on-surface structures mapping,
wherein the first frequency is greater than 1 gigahertz and wherein the second frequency is greater than 1 gigahertz.

13. A method of determining an alignment of a patterned device layer of a semi-finished multilayer semiconductor device using an atomic force microscopy system, for reducing overlay error during manufacturing of the semiconductor device, wherein the semi-finished multilayer semiconductor device comprises a resist layer covering one or more layers including the patterned device layer, and wherein the atomic force microscopy system comprises at least one scan head, the scan head including a probe, the probe comprising a cantilever and a probe tip arranged on the cantilever, wherein the method comprises:
moving the probe tip and the semiconductor device relative to each other in one or more directions parallel to a surface for a scanning of the surface with the probe tip; and
monitoring a motion of the probe tip relative to the scan head with a tip position detector during said scanning for obtaining an output signal;
applying, during said scanning, a first acoustic input signal comprising a signal component at a first frequency to at least one of the probe or the semiconductor device;
applying, during said scanning, a second acoustic input signal comprising a signal component at a second frequency to the semiconductor device;
analyzing the output signal for providing at least a subsurface nanostructures mapping below a surface of the semiconductor device; and determining the alignment of the patterned device layer based on the analysis;

adapting, based on the determined alignment of the patterned device, the alignment of the semiconductor device relative to an alignment of a further patterned device layer to be formed on the semiconductor device, wherein the first frequency is greater than 1 gigahertz and wherein the second frequency is greater than 1 gigahertz.

\* \* \* \* \*